US012702003B2

(12) United States Patent
Watanabe et al.

(10) Patent No.: US 12,702,003 B2
(45) Date of Patent: Aug. 4, 2026

(54) HEAT RADIATION COMPONENT AND ELECTRONIC APPARATUS

(71) Applicant: LENOVO (SINGAPORE) PTE. LTD., Singapore (SG)

(72) Inventors: Ryota Watanabe, Yokohama (JP); Masahiro Kitamura, Yokohama (JP); Junki Hashiba, Yokohama (JP); Takuroh Kamimura, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 400 days.

(21) Appl. No.: 18/357,364

(22) Filed: Jul. 24, 2023

(65) Prior Publication Data

US 2024/0038622 A1      Feb. 1, 2024

(30) Foreign Application Priority Data

Jul. 28, 2022    (JP) ................................. 2022-120627

(51) Int. Cl.
　*H10W 40/25*　　　(2026.01)
　*G06F 1/20*　　　　(2006.01)
(52) U.S. Cl.
　CPC ............ *H10W 40/257* (2026.01); *G06F 1/20* (2013.01); *H10W 40/255* (2026.01); *H10W 40/258* (2026.01)
(58) Field of Classification Search
　CPC ............. H01L 23/3733; H01L 23/3735; H01L 23/3736; H01L 23/467; H01L 23/473; H10W 40/255; H10W 40/257; H10W 40/258
　USPC .......................... 361/704, 706, 707, 709–720
　See application file for complete search history.

(56) References Cited

U.S. PATENT DOCUMENTS

| | | | | | |
|---|---|---|---|---|---|
| 4,323,914 | A | * | 4/1982 | Berndlmaier ....... | H01L 23/3121 257/E23.125 |
| 5,000,256 | A | * | 3/1991 | Tousignant ........... | H10W 40/77 165/104.19 |
| 6,665,186 | B1 | * | 12/2003 | Calmidi ................ | H01L 23/473 361/708 |
| 7,221,571 | B2 | * | 5/2007 | Kubo ...................... | H01L 23/42 257/E23.09 |

(Continued)

FOREIGN PATENT DOCUMENTS

| | | | | | |
|---|---|---|---|---|---|
| CN | 114628342 A | * | 6/2022 | ........... | H01L 23/367 |
| JP | 2003332505 A | | 11/2003 | | |

(Continued)

OTHER PUBLICATIONS

Search report dated Dec. 20, 2023, in EP 23186563.5-1211.

*Primary Examiner* — Joel M Attey
*Assistant Examiner* — For K Ling
(74) *Attorney, Agent, or Firm* — SHIMOKAJI IP

(57) ABSTRACT

A heat radiation component radiates heat from a GPU that generates heat, and includes a mesh impregnated with a liquid metal, and two film bodies that cover both surfaces of the mesh and have sealed peripheries. An opening is formed in the film body. In the mesh, an exposed portion that is exposed through the opening abuts on a surface of a die of the GPU. In the mesh, the portion exposed through the opening is formed of two layers, a first layer and a second layer. In the mesh, an area of the exposed portion exposed through the opening is smaller than an area of the other portion.

6 Claims, 9 Drawing Sheets

(56)                 References Cited

U.S. PATENT DOCUMENTS

| | | | | |
|---|---|---|---|---|
| 8,477,500 B2 * | 7/2013 | Deng | ................. | H01L 23/3736 |
| | | | | 361/720 |
| 2005/0073816 A1 * | 4/2005 | Hill | .................... | H10W 40/735 |
| | | | | 361/708 |
| 2006/0033205 A1 | 2/2006 | Sauciuc | | |
| 2006/0113105 A1 | 6/2006 | Kubo | | |
| 2006/0120051 A1 * | 6/2006 | Macris | ................. | H10W 40/70 |
| | | | | 257/E23.137 |
| 2006/0157223 A1 * | 7/2006 | Gelorme | ................ | H01L 23/42 |
| | | | | 165/185 |
| 2006/0225874 A1 * | 10/2006 | Shives | ................... | F28F 21/02 |
| | | | | 428/408 |
| 2007/0091574 A1 * | 4/2007 | Jarrett | .................. | H10W 40/77 |
| | | | | 257/E23.09 |
| 2007/0141378 A1 * | 6/2007 | Pacheco | ................. | H01L 23/42 |
| | | | | 257/E23.087 |
| 2010/0066178 A1 | 3/2010 | Lower | | |
| 2013/0083488 A1 * | 4/2013 | Watanabe | ............ | H10W 76/60 |
| | | | | 257/E23.083 |
| 2018/0374716 A1 * | 12/2018 | Stathakis | ............. | H10W 40/25 |
| 2019/0098743 A1 * | 3/2019 | Molla | ................ | H01L 23/3735 |
| 2020/0350231 A1 * | 11/2020 | Shen | ................... | H01L 23/4334 |
| 2022/0262759 A1 * | 8/2022 | Tsuchida | ............... | H01L 23/562 |

FOREIGN PATENT DOCUMENTS

| | | | |
|---|---|---|---|
| JP | 2004146819 A | 5/2004 | |
| WO | 2006078334 A1 | 7/2006 | |

* cited by examiner

HEAT RADIATION COMPONENT AND ELECTRONIC APPARATUS

BACKGROUND OF THE INVENTION

Field of the Invention

The present invention relates to a heat radiation component that radiates heat from an electric component that generates heat, and an electronic apparatus including the heat radiation component.

Description of the Related Art

A semiconductor chip, such as a GPU, a CPU, or the like, is provided in a portable information apparatus, such as a laptop PC or the like. The GPU and the CPU have a shape having a substrate which is a portion to be mounted on a board and a die having a rectangular shape and provided on a surface of the substrate. In some cases, a small capacitor is provided in the periphery of the die on the surface of the substrate.

The semiconductor chip, such as the GPU, the CPU, or the like, is a heat generation element, and it is necessary to radiate heat depending on the power consumption (particularly under high load). In some cases, a heat radiation component, such as a vapor chamber, a heat spreader, a heat sink, or the like, is used as means for radiating heat from the GPU or the CPU to diffuse heat by causing such a heat radiation component to abut on the surface of the die.

In some cases, a heat conductive material is interposed between the die and the heat radiation component in order to efficiently transfer heat. The heat conductive material is called a thermal interface material (TIM), and examples thereof include a heat conductive sheet, grease having a heat transfer property, and the like. In addition, in recent years, a liquid metal may be applied as the TIM (for example, Japanese Unexamined Patent Application Publication No. 2004-146819).

SUMMARY OF THE INVENTION

The liquid metal has higher heat transfer property than the grease having the heat transfer property, and can effectively transfer heat from the die to the heat radiation component. On the other hand, the liquid metal has a characteristic of having higher fluidity than the grease having the heat transfer property. In a case in which the electronic apparatus is carried and moved, it is susceptible to vibration or impact. Then, the liquid metal having fluidity has a concern of leaking from a gap between the die and the heat radiation component due to a repetitive force received from the die and the heat radiation component.

In addition, although the liquid metal has an excellent heat transfer property, a slight thermal resistance may be generated by interposing the liquid metal between the heat generation element and the heat radiation component.

The present invention has been made in view of the above problems, and is to provide a heat radiation component and an electronic apparatus including the heat radiation component that do not cause leakage of a liquid metal and can reduce a thermal resistance with an electric component that generates heat.

In order to solve the above-described problems and achieve an object, a first aspect of the present invention relates to a heat radiation component that radiates heat from an electric component that generates heat, the heat radiation component including a mesh impregnated with a liquid metal, and two film bodies that cover both surfaces of the mesh and have sealed peripheries, in which an opening is formed in at least one of the two film bodies, and, in the mesh, a portion exposed through the opening abuts on a surface of the electric component.

In addition, a second aspect of the present invention relates to an electronic apparatus including an electric component that generates heat, and a heat radiation component that radiates heat from the electric component, in which the heat radiation component includes a mesh impregnated with a liquid metal, and two film bodies that cover both surfaces of the mesh and have sealed peripheries, and an opening is formed in at least one of the two film bodies, and, in the mesh, a portion exposed through the opening abuts on a surface of the electric component.

The above-described aspects of the present invention can effectively absorb heat of the electric component by the liquid metal and perform heat radiation and cooling. Also, since the liquid metal is impregnated in the mesh, no leakage occurs. Further, since the exposed portion of the mesh in the heat radiation component directly abuts on the electric component without interposing a TIM or the like, a thermal resistance can be reduced.

DETAILED DESCRIPTION OF THE INVENTION

Hereinafter, an embodiment of a heat radiation component and an electronic apparatus according to the present invention will be described in detail based on the drawings. It should be noted that the present invention is not limited to the embodiment.

Figure 1:
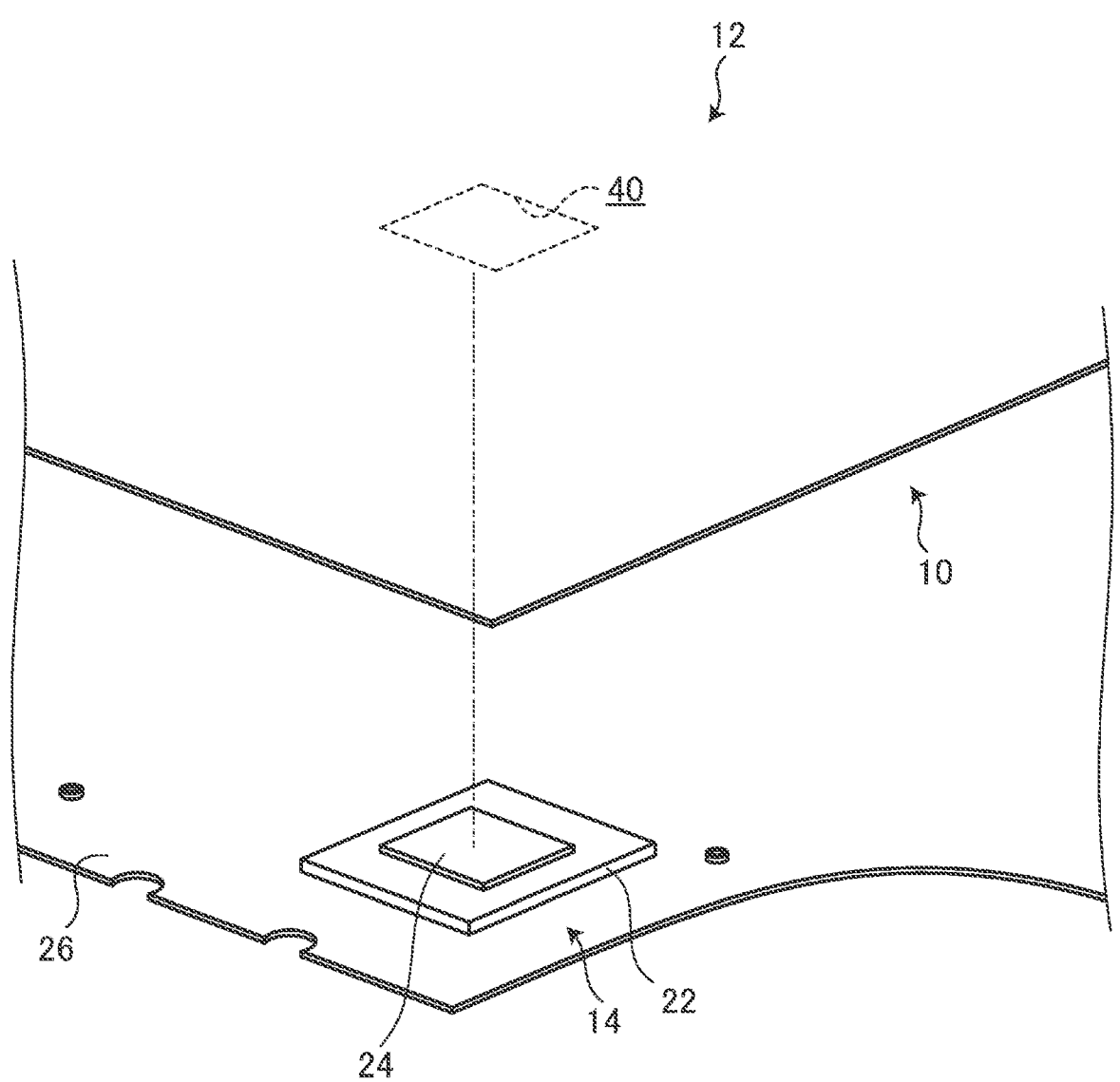
FIG. 1 is an exploded perspective view illustrating a part of a heat radiation component and a portable information apparatus according to an embodiment of the present invention.

FIG. 1 is an exploded perspective view illustrating a part of a heat radiation component 10 and a portable information apparatus 12 according to an embodiment of the present invention.

The portable information apparatus (electronic apparatus) 12 is, for example, a laptop PC, a tablet terminal, a smartphone, or the like, and includes a graphics processing unit (GPU) 14. Although the heat radiation component 10 is suitably used for the portable information apparatus 12, the heat radiation component 10 can also be applied to an electronic apparatus, such as a stationary desktop computer or the like. The GPU 14 is a semiconductor chip capable of performing real-time image processing. Since the GPU 14 performs high-speed computing, a corresponding amount of heat is generated, and thus heat radiation means is required. The portable information apparatus 12 includes the heat radiation component 10 as the heat radiation means of the GPU 14.

Figure 2:
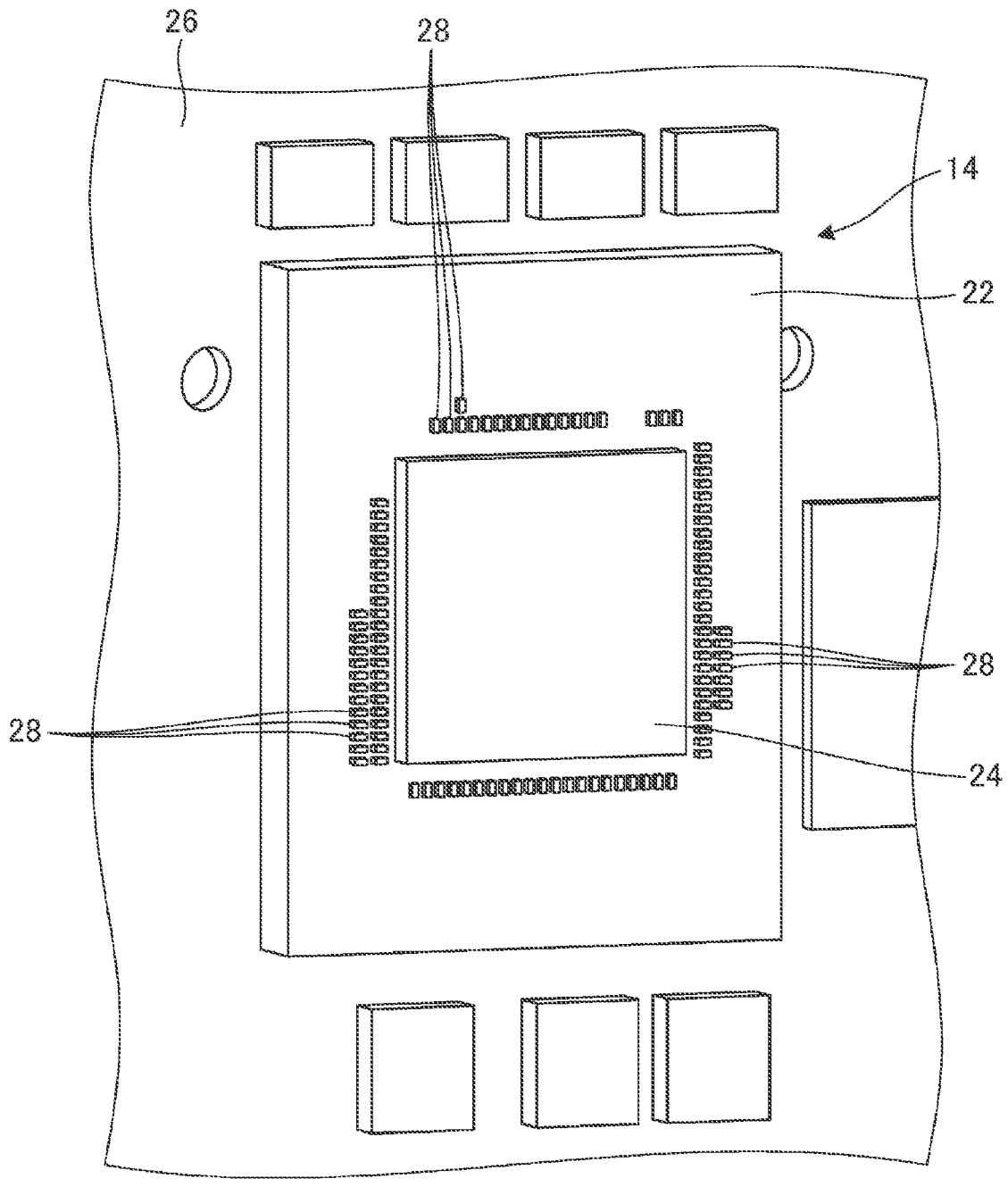
FIG. 2 is a perspective view of a GPU.

FIG. 2 is a perspective view of the GPU 14. The GPU 14 includes a substrate 22 and a die (electric component) 24. The substrate 22 is a thin plate-shaped portion that is mounted on the board 26, and has a rectangular shape in a plan view. The die 24 is a portion including an arithmetic circuit, and is provided to slightly protrude from an upper surface of the substrate 22. The die 24 has a rectangular shape smaller than the substrate 22 in a plan view, and is provided at substantially the center of the upper surface of the substrate 22. The GPU 14 is one of the components that generate the most heat in the portable information apparatus 12, in particular, the die 24 generates heat.

Stated another way, the die 24 is one of the electric components in the portable information apparatus 12 that generates the most heat. It should be noted that the portable information apparatus 12 includes a central processing unit (CPU). Similar to the GPU, the CPU includes a substrate and a die, and the heat radiation component 10 can be applied. Further, the heat radiation component 10 can also be applied to heat radiation of the semiconductor chip other than the GPU 14 or the CPU, or other electric components that generate heat.

A number of small capacitors 28 are arranged on the upper surface of the substrate 22 to surround the die 24. The capacitors 28 are arranged on all sides of the die 24 in one or two rows depending on a location. The capacitors 28 are provided in a relatively close vicinity to the die 24. A height of the capacitor 28 is lower than a height of the die 24. The capacitors 28 are covered with an insulating material 34 (see FIG. 5). The insulating material 34 is, for example, an adhesive or an ultraviolet curable coating material, and is formed in a film shape.

Figure 3:
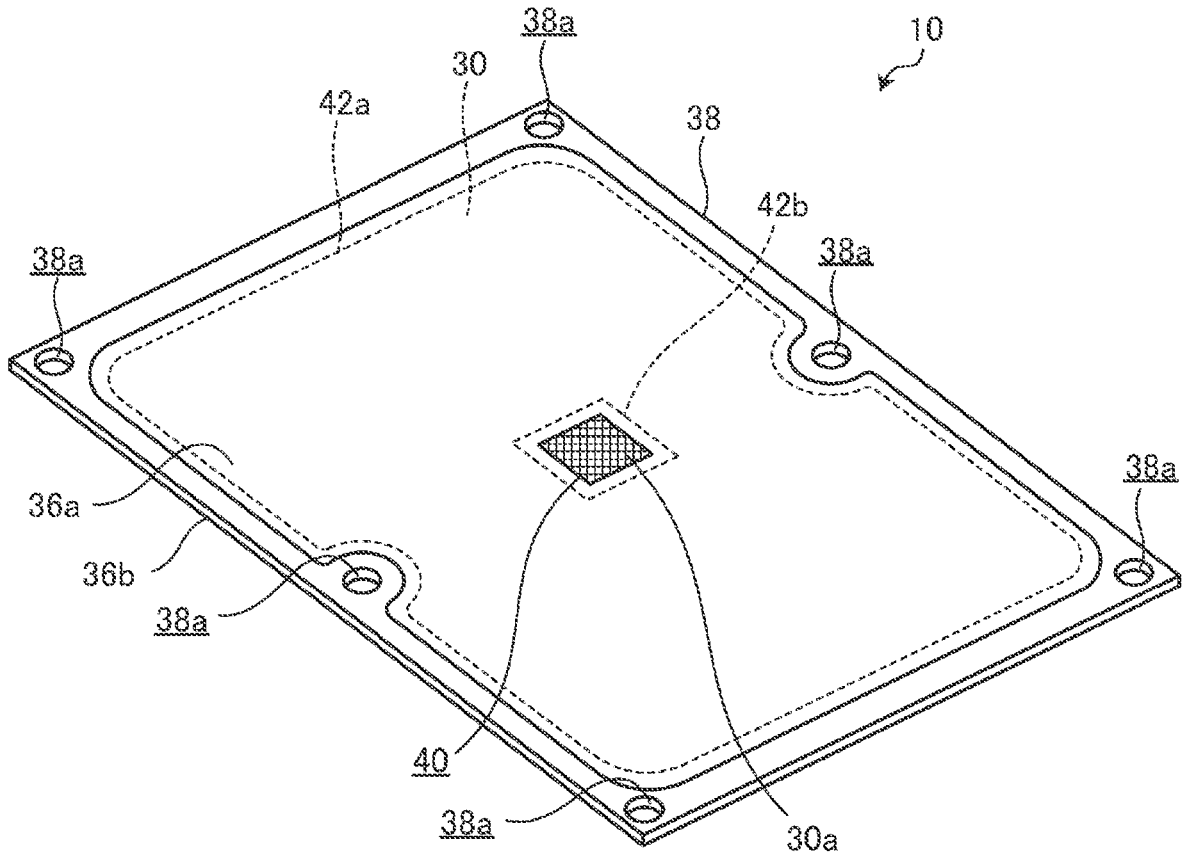
FIG. 3 is a schematic perspective view of the heat radiation component.
Figure 4:
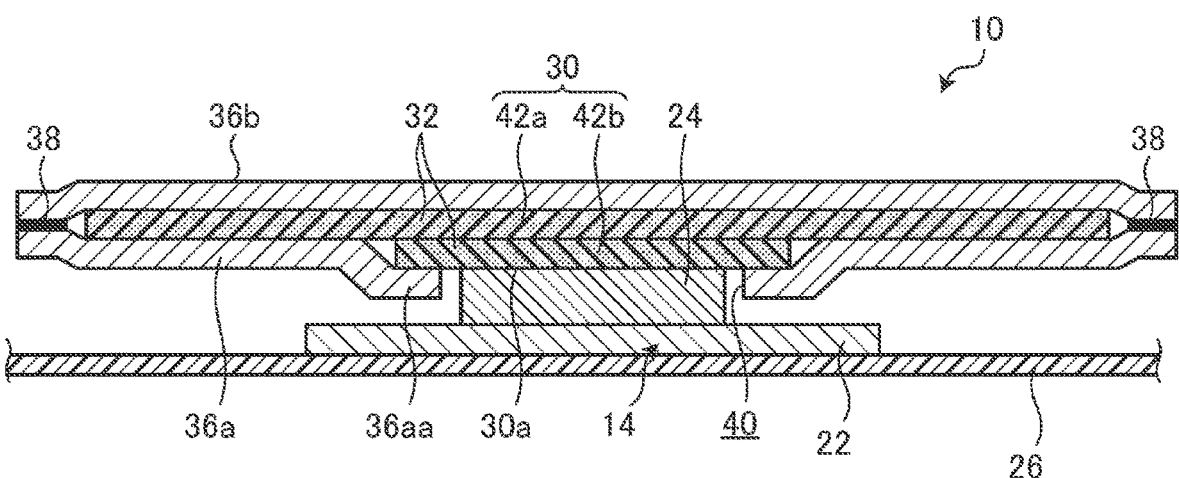
FIG. 4 is a schematic cross-sectional side view of the heat radiation component.

FIG. 3 is a schematic perspective view of the heat radiation component 10. FIG. 4 is a schematic cross-sectional side view of the heat radiation component 10. The heat radiation component 10 radiates heat from an electric component, such as the GPU 14 or the like that generates heat, and includes the mesh 30 and a first film body 36a and a second film body 36b that cover both surfaces of the mesh 30. The mesh 30 is impregnated with the liquid metal 32.

As the mesh 30, the mesh 30 in which the wire is knitted, the mesh 30 in which a large number of holes are provided in a plate material by etching or the like, or the like can be applied. The mesh 30 may be a resin material, such as polyester, glass fiber, or the like. In a case in which the mesh 30 is made of a metal material, suitable heat transfer performance can be obtained. In a case in which the mesh 30 is made of the resin material, the mesh 30 is less likely to damage the electric component that abuts on the mesh 30.

The mesh 30 has a thickness of, for example, about 0.025 to 0.05 mm, and has appropriate flexibility and tensile strength.

In a case in which the mesh 30 is made of a metal material, such as copper, aluminum, or the like, the mesh 30 plated with a nickel material (including an alloy containing nickel as a main component) may be used. That is, by using the nickel material in at least the surface of the mesh 30, it is possible to prevent the mesh 30 from being degenerated by the liquid metal 32. In a case in which the mesh 30 is made of the nickel material, the plating treatment can be omitted. Also, suitable thermal conductivity can be obtained by nickel-plating a copper material or an aluminum material. The mesh 30 may be replaced with another porous material that can be impregnated with the liquid metal 32, for example, a foam, such as a sponge or the like.

The liquid metal 32 contains, for example, gallium as a main component, and is basically a metal that is a liquid at room temperature, but may be a phase change material or the like that is a liquid at a temperature in a normal use state in which at least the board 26 of the portable information apparatus 12 is energized to operate the GPU 14. Since the liquid metal 32 is the metal, the liquid metal 32 has excellent thermal conductivity and electric conductivity. In addition, since the liquid metal 32 is the liquid, the liquid metal 32 has fluidity. The liquid metal 32 is basically impregnated over almost the entire surface of the mesh 30.

As impregnating means, for example, the mesh 30 may be immersed in a tank of the liquid metal 32, or the liquid metal 32 may be applied to the mesh 30. In some cases, it is difficult to impregnate the liquid metal 32 in the mesh 30, but at this point in time, the handling is easy because the mesh 30 is a single unit before being incorporated into the heat radiation component 10, and six up, down, front, back, left, and right surfaces are open, and thus it is easy to impregnate the liquid metal 32. In addition, since the mesh 30 is a single unit at this point in time, it is possible to visually observe or inspect whether the liquid metal 32 is properly impregnated or by predetermined means.

The film bodies 36a and 36b are, for example, a rubber material, a poly ethylene terephthalate (PET) material, a polyurethane material, a copper foil, or the like. The film bodies 36a and 36b are in a form of a sheet, are soft, and have flexibility. The first film body 36a and the second film body 36b have the same size, and have the peripheries forming a sealing portion 38 to seal the mesh 30 inside. The sealing portion 38 is formed by, for example, welding or adhesion. The film bodies 36a and 36b are sufficiently thin, and can radiate heat of the mesh 30 held inside to the outside. Thicknesses of the film bodies 36a and 36b are about 0.2 to 0.3 mm, depending on a material.

The sealing portion 38 is formed with a screw hole 38a for fixing the heat radiation component 10. The heat radiation component is fixed to a predetermined boss portion by a screw inserted into the screw hole 38a. A reinforcing screw seat or a washer may be provided in the periphery of the screw hole 38a. An adhesive tape or the like may be used as fixing means of the heat radiation component 10. The mesh 30 has a shape to avoid the screw hole 38a while almost along an inner peripheral edge of the sealing portion 38.

Figure 5:
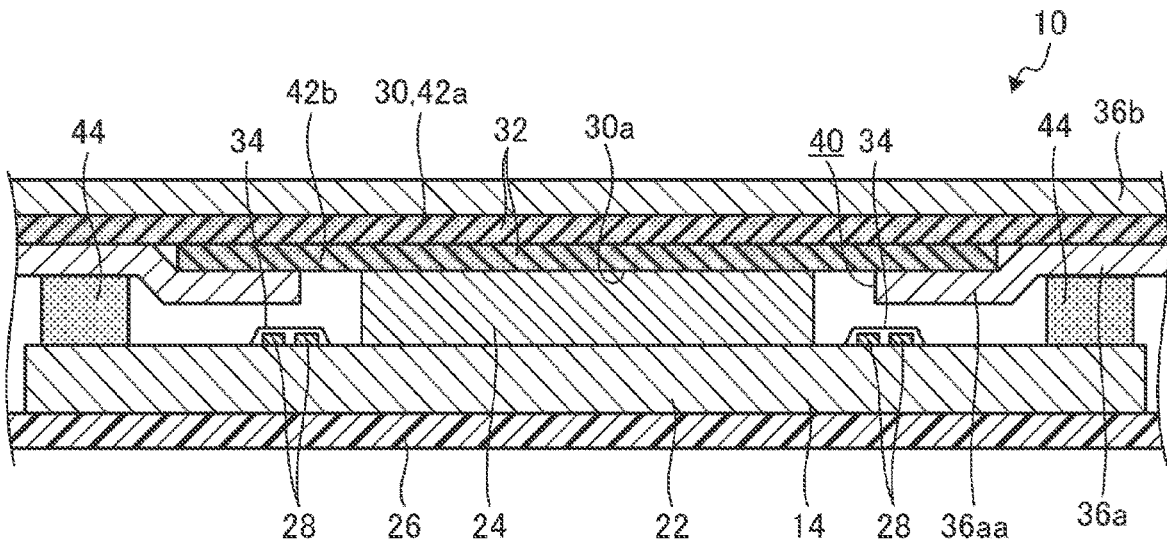
FIG. 5 is a schematic cross-sectional side view of the GPU and the heat radiation component applied to a die of the GPU.

FIG. 5 is a schematic cross-sectional side view of the GPU 14 and the heat radiation component 10 applied to the die 24 of the GPU 14. The first film body 36a is formed with an opening 40 having a rectangular shape (see FIG. 3). The opening 40 is formed at a position corresponding to the die 24 (see FIG. 1), and is slightly larger than an area of the die 24. In the heat radiation component 10, the first film body 36a and the second film body 36b are sealed by the sealing portion 38, but the inside is not in a completely closed state because the opening 40 is formed.

The mesh 30, the opening 40 and a peripheral portion thereof have a two-layer structure including a first layer 42a and a second layer 42b. The first layer 42a has a large area almost along the inner peripheral edge of the sealing portion 38 (see FIG. 3). The second layer 42b is slightly larger than the opening 40, and is quite smaller than the first layer 42a. However, the second layer 42b may be further made larger depending on design conditions.

Almost the entire surface of the second layer 42b is exposed through the opening 40 and abuts on the surface of the die 24. A peripheral portion 36aa of the opening 40 in the first film body 36a overlaps an edge of the second layer 42b. That is, the first layer 42a and the second layer 42b are held in layers by the peripheral portion 36aa and the second film body 36b. The first layer 42a and the second layer 42b are each impregnated with the liquid metal 32, and basically no void is present between the first layer 42a and the second layer 42b. However, a slight void may be generated due to reasons, such as the convenience of an impregnation process of the liquid metal 32 or the like. The first layer 42a and the second layer 42b are held in layers by the first film body 36a and the second film body 36b without being particularly fixed, but a part between the first layer 42a and the second layer 42b may be fixed by welding, adhesion, or the like depending on design conditions.

In the mesh 30, an area of the exposed portion 30a that is exposed through the opening 40 and abuts on the die 24 is much smaller than an area of the other portion, and heat of the die 24 can be diffused over a wide range to perform heat radiation and cooling. Since the exposed portion 30a has a two-layer structure including the first layer 42a and the second layer 42b, the liquid metal 32 is impregnated in a relatively large amount, a heat capacity is large, and heat is easily absorbed from the die 24. Although the mesh 30 has the exposed portion 30a, the impregnated liquid metal 32 is held by the capillary phenomenon, so that leakage does not occur even in a case in which a certain degree of vibration or the like is applied. The liquid metal 32 impregnated in the mesh 30 is not unevenly distributed due to an inclination of the portable information apparatus 12.

The liquid metal 32 basically does not abut on the capacitors 28, but the reliability is further improved in a case in which the capacitors 28 are covered with the insulating material 34. In addition, the liquid metal 32 basically does not abut on other electric components mounted on the board 26, but the reliability is further improved by partitioning four circumferences of the substrate 22 and the heat radiation component 10 by the elastic material 44. The elastic material 44 is, for example, a sponge. The insulating material 34 and the elastic material 44 may be omitted depending on design conditions.

The heat radiation component 10 and the portable information apparatus 12 configured as described above can effectively absorb heat of the die 24 by the liquid metal 32 to perform the diffusion and cooling, and no leakage occurs because the liquid metal 32 is impregnated in the mesh 30.

In the heat radiation component 10 according to the present embodiment 10, since the exposed portion 30a directly abuts on the die 24, the thermal resistance can be reduced as compared with a case in which the TIM is interposed. Since the heat radiation component 10 also serves as the TIM the number of components is reduced and assembly is easy.

In a case in which the thickness of the mesh 30 is set to about 0.025 to 0.05 mm and the thicknesses of the film bodies 36a and 36b are set to about 0.2 to 0.3 mm, the total thickness of the heat radiation component 10 can be realized to be about 0.1 mm, and thus the mesh 30 has sufficient flexibility. Therefore, the mesh 30 has a high degree of freedom in layout in a chassis of the portable information apparatus 12, and can be provided over a wide range while avoiding interference with other constituent elements. Since the heat radiation component 10 is thin, the heat radiation component 10 can be disposed even in a narrow gap. Since the heat radiation component 10 includes the mesh 30, the heat radiation component 10 has an appropriate strength.

Examples of a heat radiation component in the related art include a vapor chamber and a heat spreader, such as a copper plate, a graphite sheet, or the like. Since these heat radiation components are basically thermally connected to the heat generation element via a TIM material, the thermal resistance may be generated. In addition, since the vapor chamber and the copper plate have excellent heat transfer property but have no flexibility, the degree of freedom in layout is lower as compared with the heat radiation component 10 according to the present embodiment. Although the graphite sheet has excellent flexibility, but is inferior in heat capacity to the heat radiation component 10 according to the present embodiment. That is, the heat radiation component 10 has excellent flexibility, heat capacity, and heat transfer property as compared with the heat radiation component in the related art.

Figure 6:
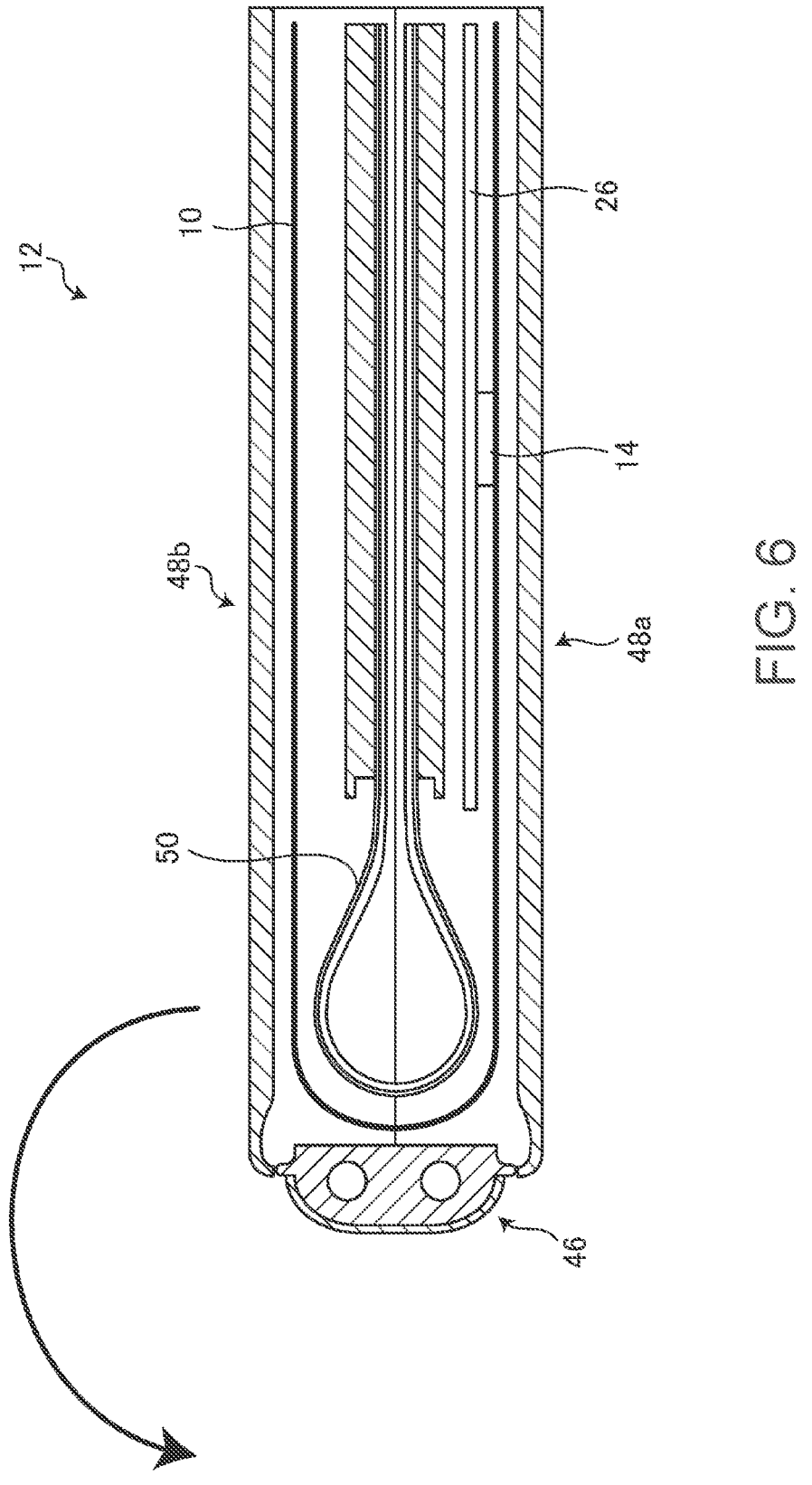
FIG. 6 is a schematic cross-sectional side view of a portable information apparatus including the heat radiation component.

FIG. 6 is a schematic cross-sectional side view of the portable information apparatus 12 including the heat radiation component 10. The portable information apparatus 12 illustrated here is a so-called foldable type, and includes a first chassis 48a and a second chassis 48b that are connected in a foldable manner via a hinge mechanism 46. The portable information apparatus 12 includes a display 50 over the first chassis 48a and the second chassis 48b. The display 50 is an organic EL or the like, which is soft, and is bent according to a relative rotation of the first chassis 48a and the second chassis 48b. FIG. 6 illustrates a folded state of the portable information apparatus 12, but the portable information apparatus 12 becomes a flat state in a case in which the first chassis 48a and the second chassis 48b are opened as indicated by an arrow. Since the heat radiation component 10 has flexibility, the heat radiation component 10 can be provided over the first chassis 48a and the second chassis 48b in such a portable information apparatus 12, which is the foldable type, and a large area can be ensured. As a result, in the GPU 14, the heat radiation and cooling are effectively performed. In addition, the first chassis 48a and the second chassis 48b are thermally connected to each other via the heat radiation component 10, and the temperature is made uniform.

Hereinafter, a modification example of the heat radiation component 10 will be described. For each modification example, the same constituent elements as the constituent elements of the heat radiation component 10 are designated by the same reference numerals, and the detailed description thereof will be omitted. The same applies to the modification examples.

Figure 7:
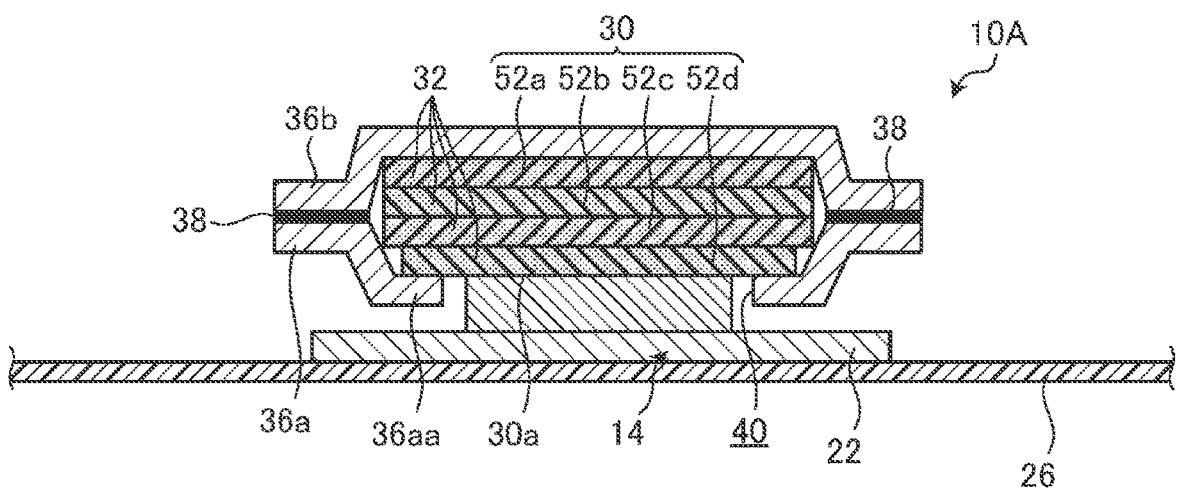
FIG. 7 is a schematic cross-sectional side view of a heat radiation component according to a first modification example.

FIG. 7 is a schematic cross-sectional side view of a heat radiation component 10A according to a first modification example. The mesh 30 of the heat radiation component 10A has four layers, a first layer 52a, a second layer 52b, a third layer 52c, and a fourth layer 52d, instead of the first layer 42a and the second layer 42b in the heat radiation component 10 described above. In the same manner as the second layer 42b, the fourth layer 52d forms the exposed portion 30a that is exposed through the opening 40 and abuts the die 24. The layers 52*a* to 52*c* are obtained by replacing one first layer 42*a* described above with three layers, but the area thereof is smaller than the area of the first layer 42*a* and slightly larger than the areas of the die 24 and the fourth layer 52*d*.

In such a heat radiation component 10A, although the area of the mesh 30 is relatively small, there is a certain volume due to a multilayer structure, and each of the layers 52*a* to 52*d* is impregnated with the liquid metal 32. Therefore, a large heat capacity is ensured, and heat of the die 24 can be effectively absorbed.

Figure 8:
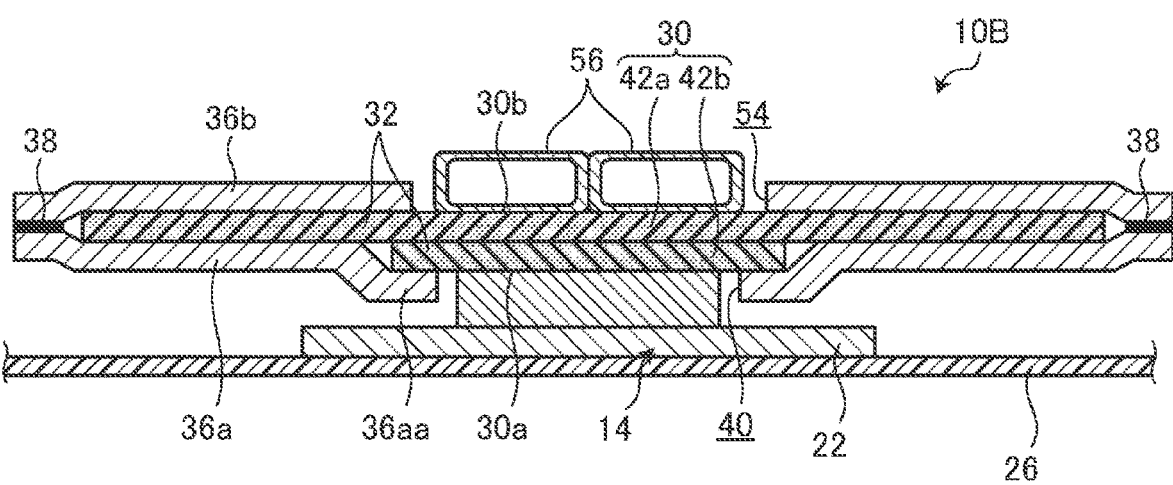
FIG. 8 is a schematic cross-sectional side view of a heat radiation component according to a second modification example.

FIG. 8 is a schematic cross-sectional side view of a heat radiation component 10B according to a second modification example. In the heat radiation component 10B, an opening 54 is formed in the second film body 36*b* at a position facing the opening 40, and the first layer 42*a* exposes an exposed portion 30*b* through the opening 54. Another heat radiation component 56 abuts on the exposed portion 30*b*. That is, the opening 40 is located on a heat input side, while the opening 54 is located on a heat output side. The other heat radiation component 56 is, for example, a heat pipe, a vapor chamber, a graphite sheet, a heat sink, or the like.

As described above, in the heat radiation component the opening is formed at a plurality of portions, and the other heat radiation component 56 abuts on the opening 54 other than the opening 40 on which the die 24 abuts. As a result, the heat radiation component 10B can be used in combination with the other heat radiation component 56, and further effective heat radiation can be performed. In addition, in a case in which the opening 54 is formed to include a portion facing the opening 40, the other heat radiation component 56 is closely connected to the die 24, which is the heat generation element, only via the thicknesses of the first layer 42*a* and the second layer 42*b*, and thus the thermal resistance is low.

Figure 9:
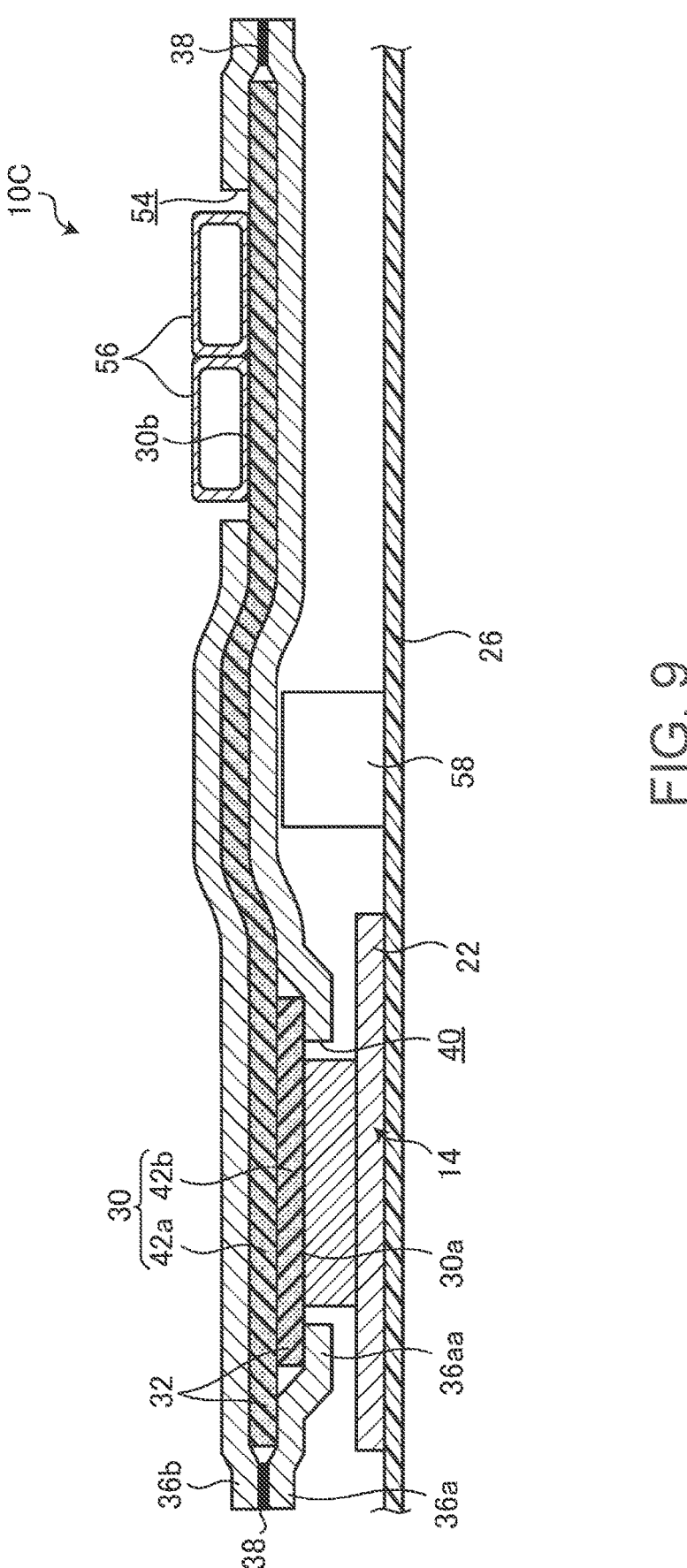
FIG. 9 is a schematic cross-sectional side view of a heat radiation component according to a third modification example.

FIG. 9 is a schematic cross-sectional side view of a heat radiation component 10C according to a third modification example. In the heat radiation component 10C, the second film body 36*b* is formed with the same opening 54 as the heat radiation component 10B, but the opening 54 is formed at a position away from the opening 40 unlike a case of the heat radiation component 10B. The other heat radiation component 56 abuts on the exposed portion 30*b* exposed through the opening 54.

As described above, even in a case in which the other heat radiation component 56 is located at a position away from the opening 40 due to the layout or the like, heat of the die 24 can be transferred to the other heat radiation component 56 via the mesh 30 by forming the opening 54 according to the position. In addition, even in a case in which the die 24 and the other heat radiation component 56 are located away from each other to some extent and some constituent components 58 (for example, a large component, such as a choke coil or the like mounted on the board 26) are present between the die 24 and the other heat radiation component 56, the heat radiation component 10C has flexibility, and thus the heat radiation component 10C can be disposed to avoid the constituent components 58. Further, although not illustrated, the opening 54 for abutting on the other heat radiation component 56 may be provided in the first film body 36*a*.

Figure 10:
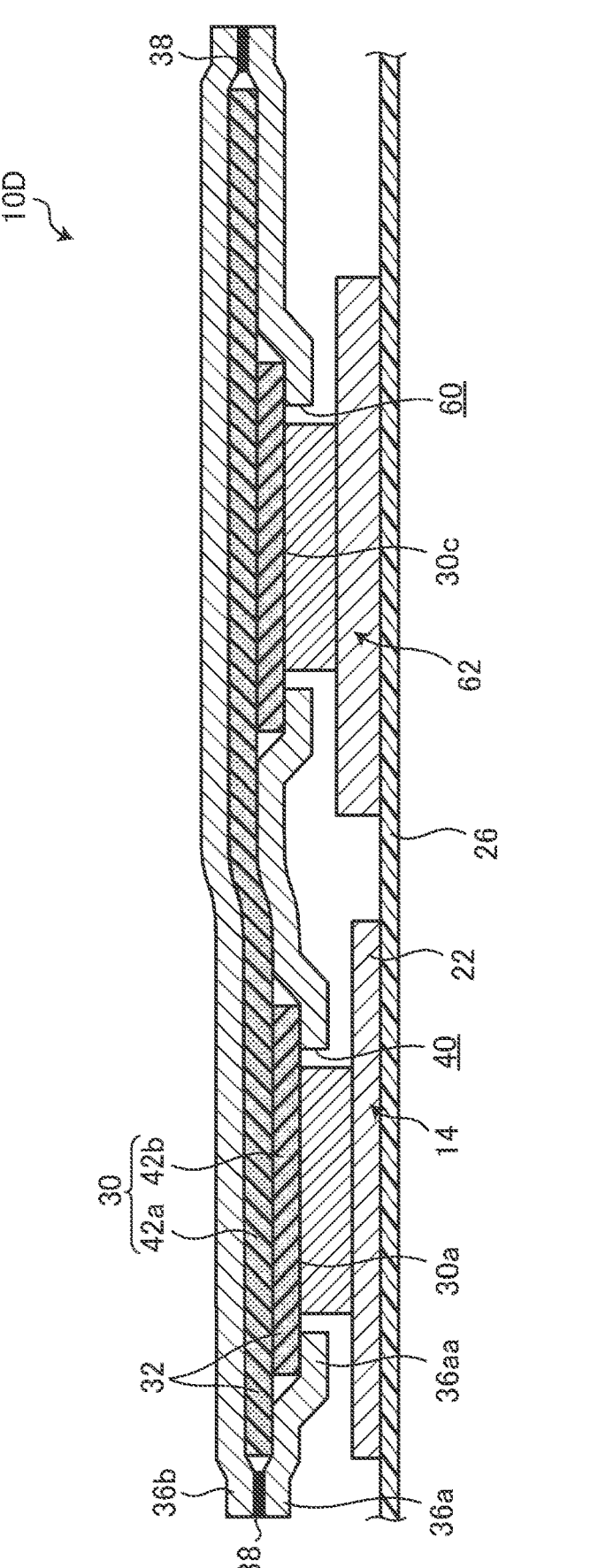
FIG. 10 is a schematic cross-sectional side view of a heat radiation component according to a fourth modification example.

FIG. 10 is a schematic cross-sectional side view of a heat radiation component 10D according to a fourth modification example. In the heat radiation component 10D, an opening 60 is formed in the first film body 36*a* at a position different from the opening 40, and the second layer 42*b* exposes an exposed portion 30*c* through the opening 60. Another heat generation element 62 abuts on the exposed portion 30*c*. That is, the opening 60 is the same as the opening 40 and corresponds to the heat input side. As described above, in a case in which a plurality of electric components that generate heat are provided in the electronic apparatus that is an application object, the openings 40 and may be formed at a plurality of portions corresponding to the plurality of electric components.

The heat generation element 62 is, for example, the CPU mounted on the board 26. Since the heat radiation component 10D has flexibility, the heat radiation component can be applied even in a case in which the heights or abutting surface angles of the die 24 of the GPU 14 and the other heat generation element 62 are different from each other. In addition, although not illustrated, the opening for abutting on the other heat generation element 62 may be provided in the second film body 36*b*. That is, in the heat radiation component according to the present embodiment, the openings 40 and 60 for abutting of the mesh 30 on the electric component that generates heat are formed in at least one of the first film body 36*a* and the second film body 36*b*. It should be noted that the other heat generation element 62 is not limited to the heat generation element 62 mounted on the board 26.

Figure 11:
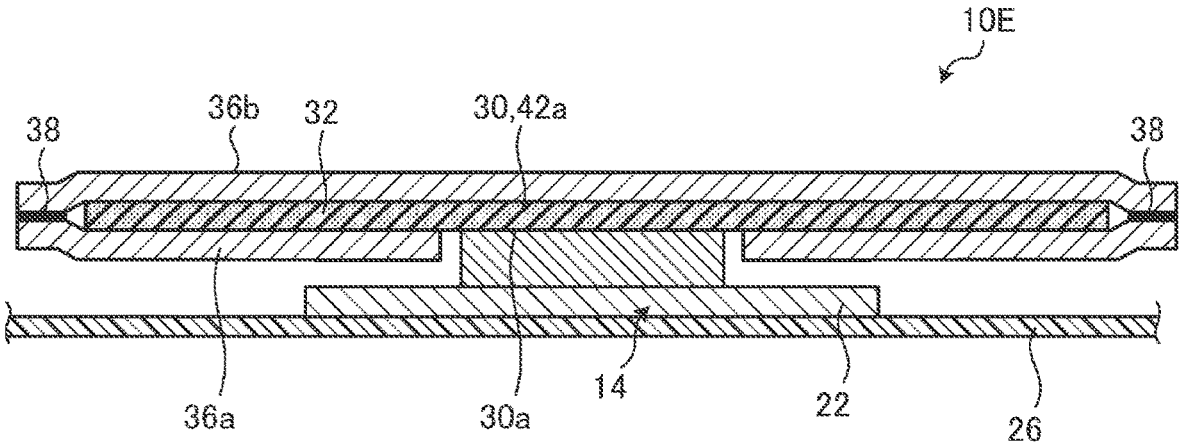
FIG. 11 is a schematic cross-sectional side view of a heat radiation component according to a fifth modification example.

FIG. 11 is a schematic cross-sectional side view of a heat radiation component 10E according to a fifth modification example. In the heat radiation component 10E, the mesh 30 has a single-layer structure. That is, in the heat radiation component 10 described above, the mesh 30 has the first layer 42*a* and the second layer 42*b*, whereas the heat radiation component 10E is formed only of the first layer 42*a* without the second layer 42*b* having a small area. Then, the first layer 42*a* forms the exposed portion 30*a* through the opening 40. In such a heat radiation component the mesh 30 has a single-layer structure, and has a simpler configuration than the heat radiation component 10 described above.

The structures of the heat radiation components 10, and 10A to 10E may be used in combination with each other, and for example, the mesh 30 of a plurality of layers in the heat radiation components 10A to 10D may be made to a single layer as in the heat radiation component 10E. The mesh 30 may have a composite structure in which a part of the mesh is provided with a hole for a liquid reservoir, a part of the mesh 30 is provided with a metal plate, or the like. The first film body 36*a* and the second film body 36*b* may be auxiliary welded or adhered via a hole formed in the mesh 30 in a portion other than the sealing portion 38 of the outer peripheral portion.

The present invention is not limited to the above-described embodiment, and there is no doubt that the present invention can be freely changed without departing from the gist of the present invention.

The invention claimed is:

1. A heat radiation component that radiates heat from an electric component that generates heat, the heat radiation component comprising:
   a mesh impregnated with a liquid metal, wherein the mesh is entirely on a single plane; and
   two film bodies that cover surfaces of the mesh and have sealed peripheries,
   wherein an opening is in at least one of the two film bodies and a portion of the mesh is exposed through the opening to abut a surface of the electric component.

2. The heat radiation component according to claim 1, wherein the portion of the mesh exposed through the opening is a plurality of layers.

3. The heat radiation component according to claim 1, wherein an area of the portion of the mesh exposed through the opening is smaller than an area of another portion of the mesh.

4. The heat radiation component according to claim 1, wherein a plurality of the electric components is in an electronic apparatus, and the opening is formed at a plurality of portions of the mesh corresponding to the plurality of electric components.

5. The heat radiation component according to claim 1, wherein the opening is at a plurality of portions of the mesh, and another heat radiation component abuts another opening in a portion of the mesh other than a portion of the mesh that abuts the electric component.

6. An electronic apparatus comprising:

an electric component that generates heat; and a heat radiation component that radiates heat from the electric component, wherein the heat radiation component includes a mesh impregnated with a liquid metal, wherein the mesh is entirely on a single plane, and two film bodies that cover surfaces of the mesh and have sealed peripheries, and an opening is in at least one of the two film bodies and a portion of the mesh is exposed through the opening to abut a surface of the electric component.

\*   \*   \*   \*   \*